United States Patent [19]

Aota et al.

[11] Patent Number: 5,564,032

[45] Date of Patent: Oct. 8, 1996

[54] CONTROL APPARATUS FOR CONTROLLING MEMORY UNIT CAPABLE OF SELECTING AN ELECTRICALLY ERASABLE NON-VOLATILE MEMORY AND LOADING INFORMATION STORED THEREIN

[75] Inventors: Masahiro Aota, Kawasaki; Seiji Komatuda, Yokote; Nozomu Nyui, Kawasaki; Tetsuya Hanawa, Kawasaki; Shinichi Wakayama, Kawasaki; Masahiro Konno, Kawasaki; Kazuhiro Satoh, Kawasaki, all of Japan

[73] Assignee: Fujitsu Limited, Kawasaki, Japan

[21] Appl. No.: 149,113

[22] Filed: Nov. 9, 1993

[30] Foreign Application Priority Data

Nov. 20, 1992 [JP] Japan .................. 4-312482

[51] Int. Cl.⁶ ........................... G06F 12/06
[52] U.S. Cl. .......... 395/430; 395/405; 395/492; 395/182.03
[58] Field of Search ............. 364/200 MS File, 364/900 MS File, DIG. 12, DIG. 2; 395/425, 182.03, 428, 488–489, 430, 405, 492, 182.03; 365/900, 185

[56] References Cited

U.S. PATENT DOCUMENTS

| | | | |
|---|---|---|---|
| 4,481,574 | 11/1984 | De Fino et al. | 379/93 |
| 4,665,480 | 5/1987 | Robert et al. | 395/430 |
| 4,852,146 | 7/1989 | Hathcock et al. | 379/58 |
| 4,860,341 | 8/1989 | D'Avello et al. | 379/91 |
| 4,970,692 | 11/1990 | Ali et al. | 365/218 |
| 5,046,082 | 9/1991 | Zicker et al. | 379/59 |
| 5,200,959 | 4/1993 | Gross et al. | 371/21.6 |
| 5,297,148 | 3/1994 | Harai et al. | 371/10.2 |
| 5,321,840 | 6/1994 | Ahlin et al. | 395/700 |
| 5,361,343 | 11/1994 | Kosonocky et al. | 395/430 |
| 5,408,664 | 4/1995 | Zarrin et al. | 395/700 |
| 5,425,051 | 6/1995 | Mahany | 375/202 |

OTHER PUBLICATIONS

Zipper, *Phone Makers Mix Memories*, Electronics News, Jul. 27, 1992, p. 1.
Lee, Yvonne, *Databook introduces slim-card readers*, InfoWorld, Mar. 2, 1992, v14, n9 p. 30, 1 page.
Thryft, *High-density EEPROMs lose ground to flash*, Computer Design, v30, n6, p. 9(1), Mar. 18, 1991.
Markowitz, *Nonvolatile memories*, EDN, v34, n18, p94(14), Sep. 1, 1989.
Rohm, *Airis to rock the boat*, Computer Reseller News, Jun. 11, 1990, p. 3.
Ian Williams, *Reprogramming adds some flash to cellular communication*, Electronics, Engineering Times, n634A, p. 16(1), Mar. 28, 1991.

*Primary Examiner*—Matthew M. Kim
*Attorney, Agent, or Firm*—Armstrong, Westerman, Hattori, McLeland & Naughton

[57] ABSTRACT

A control apparatus for controlling a memory unit having an electrically erasable nonvolatile memory for storing information used in a process in an electrical equipment and a flash memory storing a processing program for executing the process in the electrical equipment. The control apparatus includes a loading program for loading information into the flash memory, which program is stored in the electrically erasable nonvolatile memory, a memory selecting circuit for selecting the flash memory when a first selecting information is supplied thereto, and selecting the electrically erasable nonvolatile memory when a second selecting information is supplied thereto, and a loading unit for supplying the second selecting information to the memory selecting circuit under a condition in which a program voltage is supplied from an external power supply thereto and for loading information in accordance with the loading program stored in the electrically erasable nonvolatile memory selected by the memory selecting circuit.

15 Claims, 12 Drawing Sheets

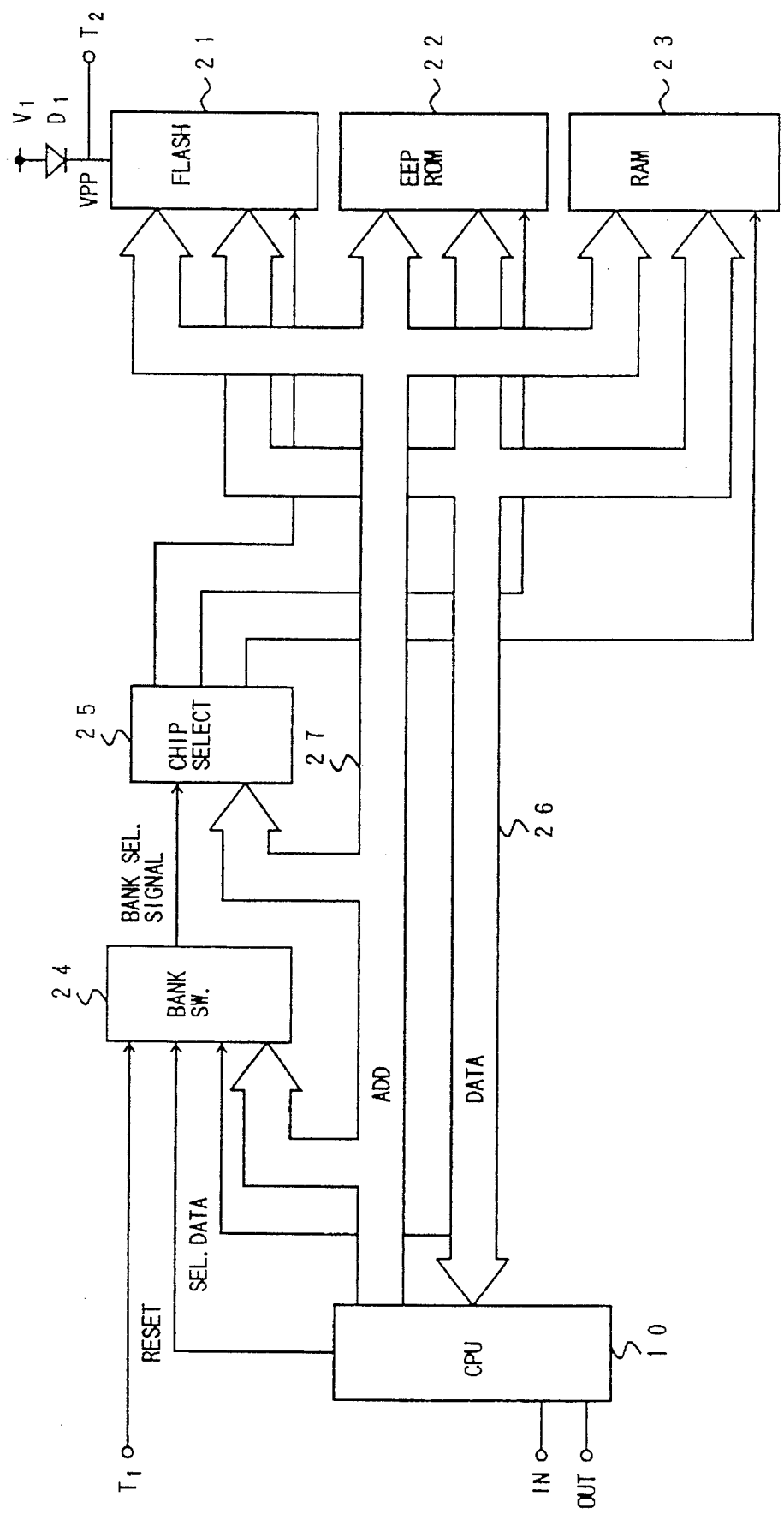
F I G. 2

CONTROL APPARATUS FOR CONTROLLING MEMORY UNIT CAPABLE OF SELECTING AN ELECTRICALLY ERASABLE NON-VOLATILE MEMORY AND LOADING INFORMATION STORED THEREIN

BACKGROUND OF THE INVENTION (1) Field of the Invention

The present invention generally relates to a control apparatus for controlling a memory unit mounted in an electric equipment, and more particularly to a control apparatus for controlling a memory unit having an electrically erasable nonvolatile memory for storing information used for a process in an electrical equipment and a flash memory for storing a processing program used to execute the process in the electrical equipment.

A flash memory is a cheap memory enabling to electrically erase information therefrom, to write information therein and to read out information therefrom, and has a large capacity. Information such as programs in the flash memory can be easily rewritten under a condition in which the flash memory is actually mounted in the electrical equipment. To rewrite the information in the flash memory actually mounted in the electrical equipment, a loading program for updating the information is required. In addition, an electrically erasable nonvolatile memory such as an EEPROM (Electrically Erasable Programmable Read Only Memory) can store information for a long time and this information can be rewritten. Thus, it has been used in the electrical equipment as an important memory to store various items of information.

(2) Description of the Related Art

Conventionally, a vehicle portable telephone in which a memory unit including an EEPROM and a flash memory is mounted has been proposed. The essential structure of the vehicle portable telephone is shown in FIG. 1. Referring to FIG. 1, a telephone set 100 connected to a vehicle onboard adapter 200 has a Central Processing Unit 10, a power source 11, a memory unit 12 and a radio unit 13. The CPU 10 carries out a communication process in accordance with a processing program stored in the memory unit 12, so that a communication between the radio unit 13 and a remote terminal unit is carried out. The memory unit 12 has a flash memory storing the processing program and the EEPROM storing telephone numbers each of which identifies a remote terminal unit. In order to rewrite the processing program stored in the flash memory under a condition where the flash memory is actually mounted in the memory unit 12, the rewriting being performed in order to upgrade the portable telephone set 100, a memory for storing a loading program is needed. Conventionally, the memory unit 12 is further provided with a ROM (Read Only Memory) to store the loading program therein.

In addition, to rewrite the information stored in the flash memory, a program voltage (e.g. 12 v) greater than a voltage required for a normal readout operation (e.g. 5 v) must be supplied to the flash memory. Conventionally in order to miniaturize the portable telephone set, input terminals through which the program voltage is supplied are provided in the portable telephone set, and an external power supply outputting the program voltage is connected to the input terminal when the information in the flash memory is rewritten.

If a dedicate ROM storing the loading program used to rewrite the information in the flash memory is provided in the memory unit 12 as has been described above, the memory unit 12 becomes large, so that the miniaturization of the portable telephone set is prevented.

In addition, as in the conventional apparatus, described above, input terminals must be provided through which the program voltage is supplied on the portable telephone set, a connector connecting the portable telephone set to an external equipment (the vehicle adapter) becomes large.

SUMMARY OF THE INVENTION

Accordingly, a general object of the present invention is to provide a novel and useful control apparatus for controlling a memory unit in which the disadvantages of the above prior art are eliminated.

A more specific object of the present invention is to provide a control apparatus for controlling a memory unit such that information in the flash memory mounted in the memory unit can be rewritten without using large electrical equipment.

The above objects of the present invention are achieved by a control apparatus for controlling a memory unit having an electrically erasable nonvolatile memory for storing information used in a process in an electrical equipment and a flash memory storing a processing program for executing the process in the electrical equipment, the control apparatus comprising: a loading program for loading information into the flash memory, which program is stored in the electrically erasable nonvolatile memory; memory selecting device for selecting the flash memory when a first selecting information is supplied thereto, and selecting the electrically erasable nonvolatile memory when a second selecting information is supplied thereto; and loading device for supplying the second selecting information to the memory selecting device under a condition in which a program voltage is supplied from an external power supply thereto and for loading information in accordance with the loading program stored in the electrically erasable nonvolatile memory selected by the memory selecting device.

According to the above invention, the loading program for loading information into the flash memory is stored in the electrically erasable nonvolatile memory which is normally needed to store various information in an electrical equipment. Thus, it is not necessary to add a dedicate memory for storing the loading program to the memory unit, so that the electric equipment is not enlarged.

Another object of the present invention is to provide a control apparatus for controlling a memory unit in which a program voltage can be supplied from an external power supply to a flash memory in the memory unit via a small number of input terminal as possible.

The above objects of the present invention are achieved by a control apparatus for controlling a memory unit having an electrically erasable nonvolatile memory for storing information used in a process in an electrical equipment and a flash memory storing a processing program for executing the process in the electrical equipment, the control apparatus comprising: a loading program for loading information into the flash memory, which program is stored in the electrically erasable nonvolatile memory; memory selecting device for selecting the flash memory when a first selecting information is supplied thereto, and selecting the electrically erasable nonvolatile memory when a second selecting information is supplied thereto; an input terminal coupled to a circuit unit in the electrical equipment via a first circuit element by which a program voltage to be supplied to the flash memory is interrupted and through which predetermined information can pass, and coupled to a power terminal of the flash memory via a second circuit element by which the predetermined information is interrupted and through which the program voltage can pass; loading device for supplying the second selecting information to the memory selecting means under a condition in which a program voltage is supplied from an external power supply thereto and for loading information in accordance with the loading program stored in the electrically erasable nonvolatile memory selected by the memory selecting device, wherein an external power supply outputting the program voltage is connected to the second terminal so that information is loaded into the flash memory by the loading means, and an external equipment outputting the predetermined information to be interrupted by the second circuit element is connected to the second terminal so that a process is carried out in accordance with the processing program stored in the flash memory in the electrical equipment.

According to the above invention, the input terminal is used to supply the program voltage to the flash memory and to supply information from the external unit to the circuit unit in the electrical equipment. That is, the input terminal is used for two purposes. Thus, a connector, which connects the electric equipment and the external unit, is not enlarged.

Additional objects, features and advantages of the present invention will become apparent from the following detailed description when read in conjunction with the accompanying drawings.

DESCRIPTION OF THE DRAWINGS

FIG. 2 is a block diagram illustrating a control apparatus for controlling a memory unit according to a first embodiment of the invention.

DESCRIPTION OF THE PREFERRED EMBODIMENT

A description will now be given, with reference to FIGS. 2–8, of a first embodiment of the present invention.

Figure 1:
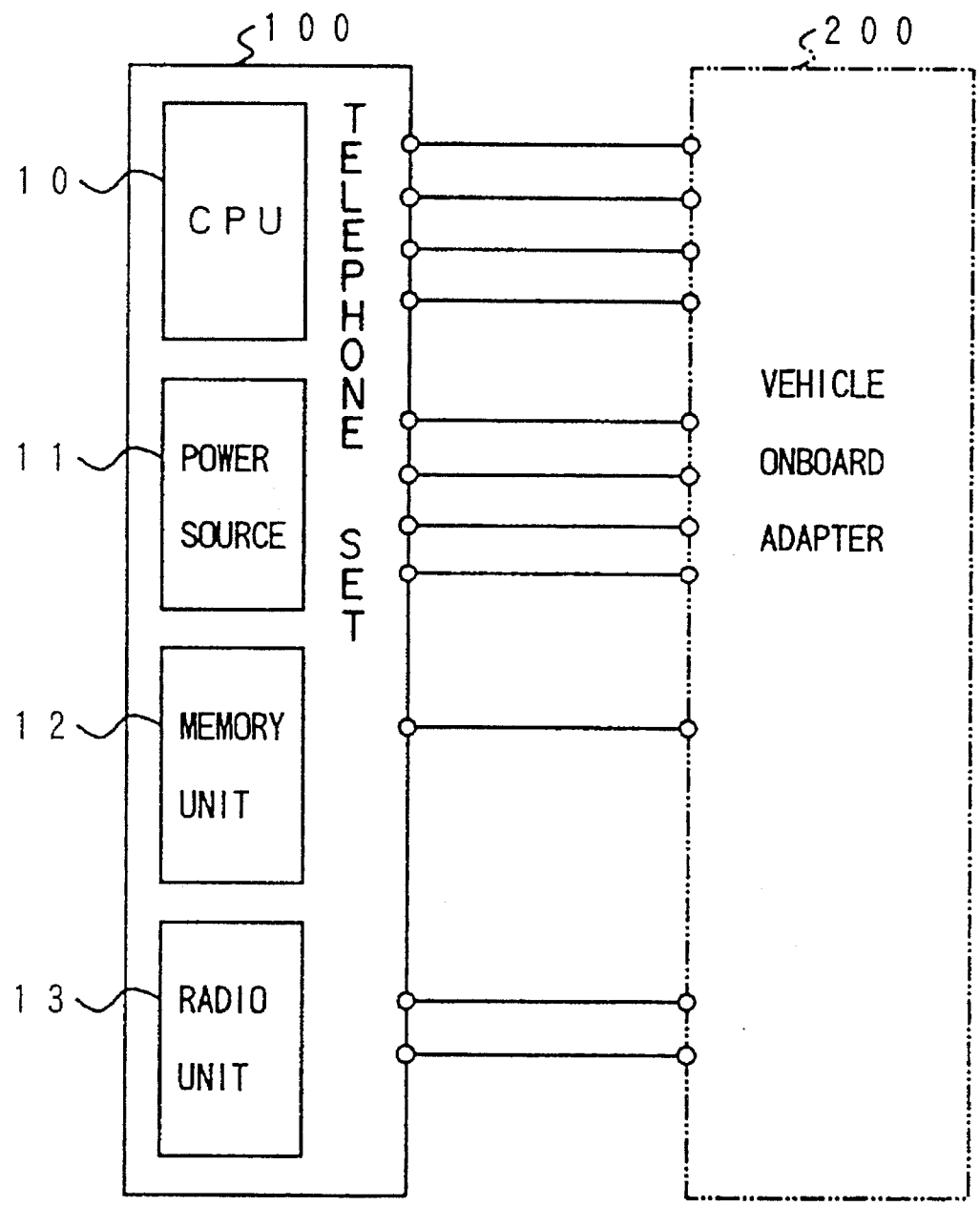
FIG. 1 is a block diagram illustrating a conventional personal telephone set connected to a vehicle adapter.
Figure 3:
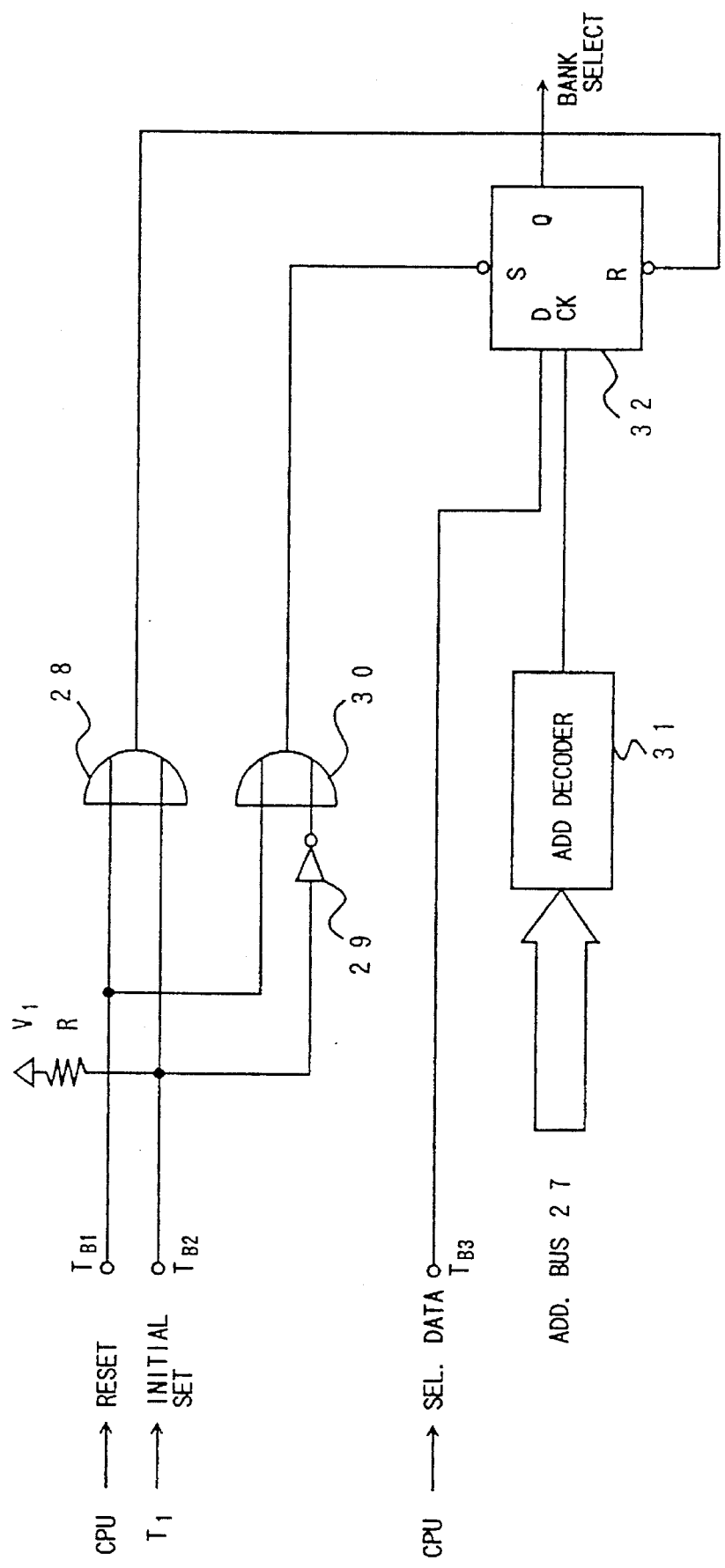
FIG. 3 is a circuit diagram illustrating a bank-switching circuit.
Figure 4:
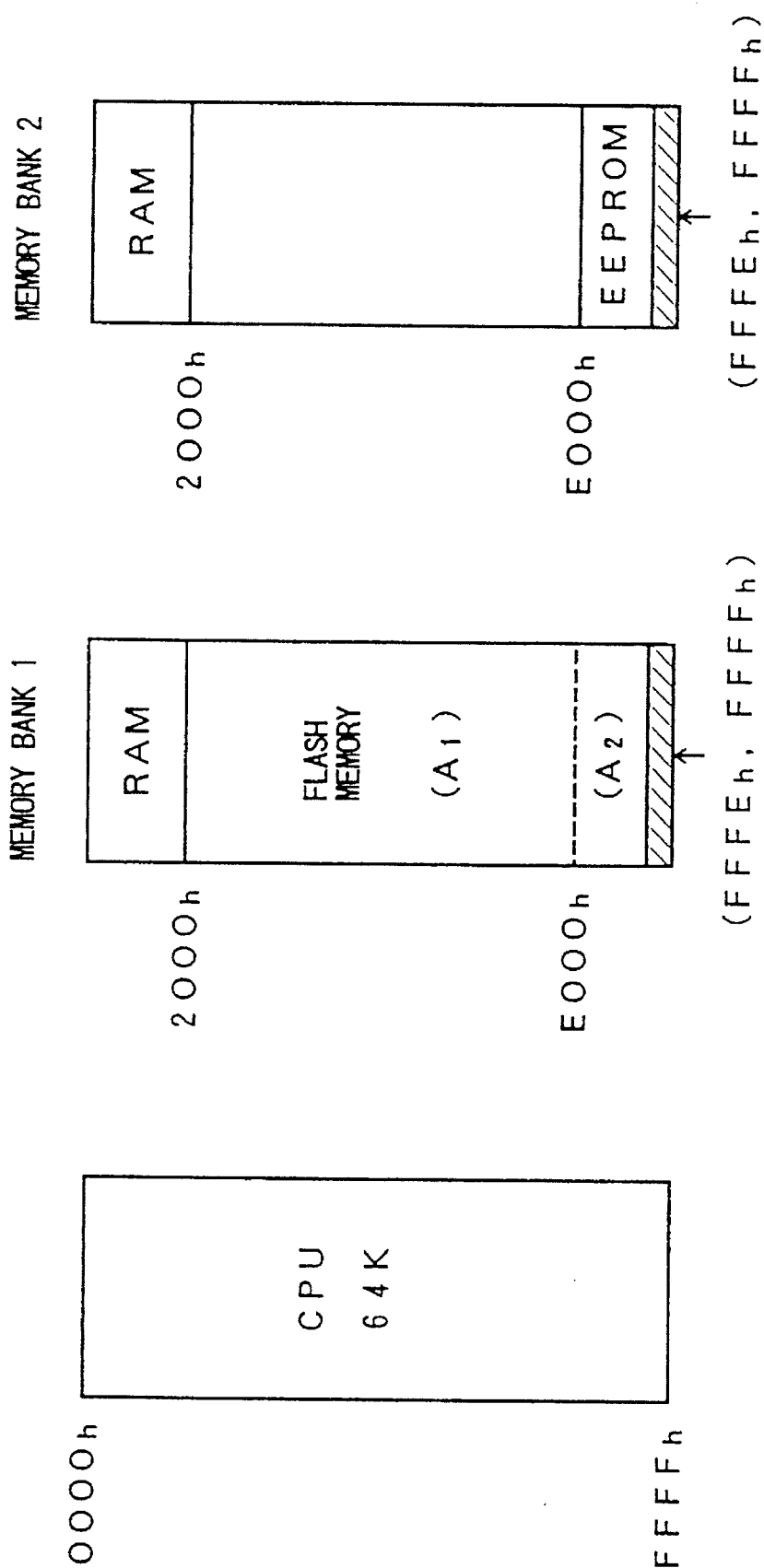
FIG. 4 is a diagram illustrating a memory bank

A control apparatus for controlling a memory unit according to a first embodiment of the present invention is formed as shown in FIG. 2. The memory unit is mounted, for example, in the portable telephone set 100 as shown in FIG. 1.

Referring to FIG. 2, the memory unit has a flash memory 21, an EEPROM 22 and a RAM (Random Access Memory) 23. The CPU 10 for controlling the portable telephone set 100 is coupled to the flash memory 21, the EEPROM 22 and the RAM 23 by a data bus 26 and an address bus 27. A bank switching circuit 24 is connected with the address bus 27 and a control terminal $T_1$, and a reset signal from the CPU 10 and a selecting data having one bit ("0" or "1") are supplied to the bank switching circuit 24. The bank switching circuit 24 outputs a bank selecting signal having a level (a high level or a low level) in accordance with a state of a control terminal T1 of the bank switching circuit 24 or the selecting data. A detailed structure of the bank switching circuit 24 will be described later (refer to FIG. 3). A chip selecting circuit 25 is connected to the address bus 27 and is provided with a bank selecting signal from the bank switching circuit 24. The chip selecting circuit 25 outputs a signal for selecting one of memories 21, 22 and 23 in accordance with the level of the bank selecting signal. A power terminal $V_{pp}$ of the flash memory 21 is connected to an input terminal $T_2$ and connected to a power line $V_1$ (e.g. 5 v) via a diode $D_1$.

The above memory unit is divided into a first memory bank (1) and a second memory bank (2) both of which are specified by addresses ($0000_h$–$FFFF_h$) supplied from the CPU 10. The first memory bank (1) is assigned to the RAM 23 and the flash memory 21, and the second memory bank (2) is assigned to the RAM 23 and the EEPROM 22. The same area ($0000_h$–$2222_h$) of the first and second memory banks (1) and (2) is assigned to the RAM 23. Calculating results obtained by the CPU 10 are temporarily stored in the RAM 23. An area ($2000_h$–$E000_h$) Of the memory bank (1) is assigned to a first area $A_1$ of the flash memory 21. A main program for executing a process in the portable telephone set is stored in the first area $A_1$ of the flash memory 21. An area ($E0000_h$–$FFFD_h$) of the memory bank (1) is assigned to a second area $A_2$ of the flash memory 21. Recovering information used to recover a loading program, stored in the EEPROM 22, for writing information in the flash memory 21 is stored in the second area $A_2$ of the flash memory 21. The recovering information includes a loading program for writing information in the EEPROM 22, a loading program for writing information in the flash memory 21 and various vectors. An area ($E000_h$–$FFFD_h$) of the second memory bank (2) is assigned to the EEPROM 22. This area corresponds to the area ($E000_h$–$FFFD_h$) to which the second area $A_2$ of the flash memory 21 is assigned in the memory bank (2). Telephone number information used in a calling process in the portable telephone set 100 is stored in the EEPROM 22 along with the loading program for writing information in the flash memory 21, vectors and the like. Reset vectors of the CPU 10 are set to $FFFE_h$ and $FFFF_h$.

The bank switching circuit 24 described above is formed as shown in FIG. 3. In reference to FIG. 3, a terminal $T_{B1}$ to which the reset signal supplied from the CPU 10 is coupled to a reset terminal (R) of a D-flip-flop 32 via an OR gate 28, and coupled to a set terminal (S) of the D-flip-flop 32 via an OR gate 30. A terminal $T_{B2}$ connected to the control terminal $T_1$ is coupled to the power line V1 (e.g. 5 v) a pull-up resistor R. The terminal $T_{B2}$ is further coupled to the reset terminal (R) of the D-flip-flop 32 via the OR gate 28, and coupled to the set terminal (S) of the D-flip-flop via an invertor 29 and the OR gate 30. A terminal $T_{B3}$, to which the selecting signal from the CPU 10 is supplied, is connected to a data terminal D of the D-flip-flop 32. The address bus 27 is connected to an address decoder 31. When an address identifying the D-flip-flop 32 is supplied to the address decoder 31, the address decoder 31 outputs a pulse signal. The pulse signal output from the address decoder 31 is supplied to a clock terminal (CK) of the D-flip-flop 32. The bank selecting signal is outputted from the output terminal (Q) of the D-flip-flop 32. When the bank selecting signal has a low level, the first memory bank (1) to which the flash memory 21 is assigned is selected, and when the bank selecting signal has a high level, the second memory bank (2) to which the EEPROM 22 is assigned is selected.

A description will now be given of an operation of the control apparatus of the memory unit.

When the EEPROM 22 is actually mounted in the memory unit 12 or when operation of the circuit in the memory unit 12 is checked, the information in the EEPROM 22 is easily damaged. Thus, after the EEPROM 22 is actually mounted in the memory unit 12 or after checking the operation of the circuit in the memory unit 12, a process is carried out in accordance with a flow chart shown in FIG. 6. In this process, the control terminal $T_1$ of the portable telephone set 100 is in an open state and the terminal $T_{B2}$ is pulled up to the power line $V_1$, so that the set terminal (S) and the reset terminal (R) of the D-flip flop 32 are maintained at a high level.

When the portable telephone set 100 is activated by turning on the power supply (S101), the CPU 10 outputs the reset signal, and the D-flip-flop 32 of the bank switching circuit 24 is reset. That is, the bank selecting signal output from the bank switching circuit 24 becomes a high level so that the second memory bank (2) is selected. An area of the EEPROM 22 which area is identified by a reset vector (FFFE$_h$, FFFF$_h$) output from the CPU 10 is then accessed (S102). Here, if the EEPROM 22 is normal (S103), the CPU 10 outputs the selecting signal "0", and the bank selecting signal from the bank switching circuit 24 becomes a low level so that the first memory bank (1) is selected. The process then jumps to a main program in the flash memory 21 (S104).

On the other hand, if the EEPROM 22 is damaged, the process does not proceed. Here, after the power supply of the portable telephone is turned off by an operator (S105) and the control terminal $T_1$ is connected to the ground (GND), the power supply of the portable telephone set 100 is turned on again (S107). As a result, the bank selecting signal becomes the low level, so that the second bank memory (2) is selected. The flash memory 21 is then accessed (S108), and the loading program for writing the information in the flash memory 21 is written in the EEPROM 22 in accordance with the loading program stored in the flash memory 21 (S109). As a result, the loading program, stored in the EEPROM 22, for writing the information in the flash memory 21 is recovered. After the loading program in the EEPROM 22 is recovered, the power supply is turned off (S111), and the process then returns to the initial state.

Figure 5:
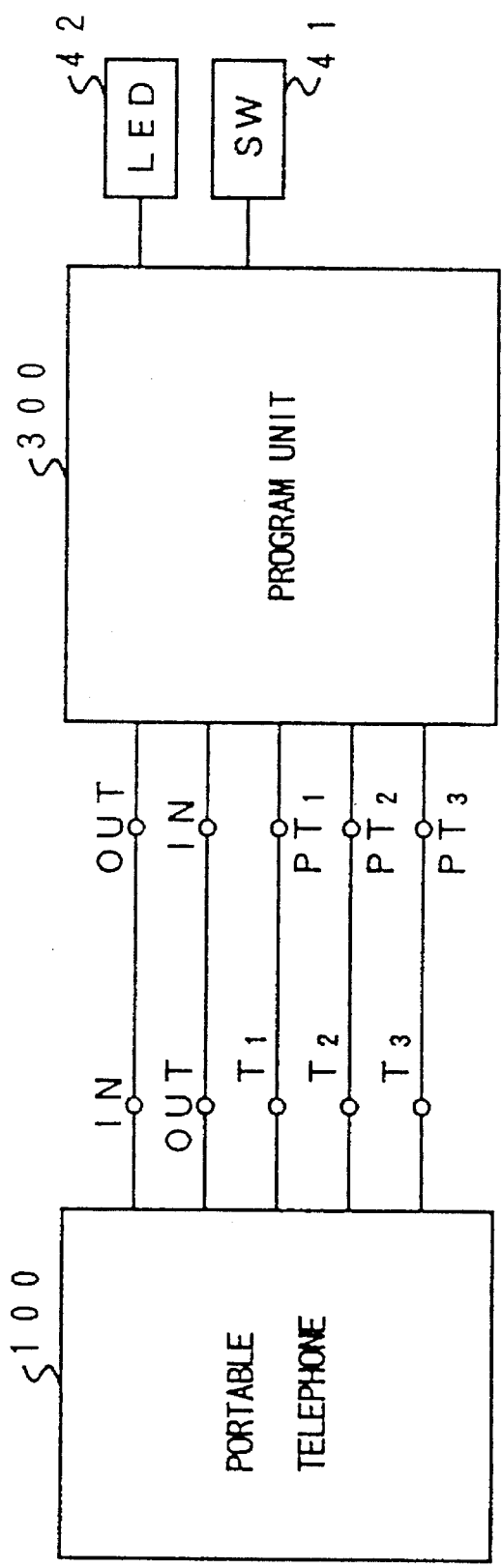
FIG. 5 is a block diagram illustrating a portable telephone set connected to a programming unit.
Figure 6:
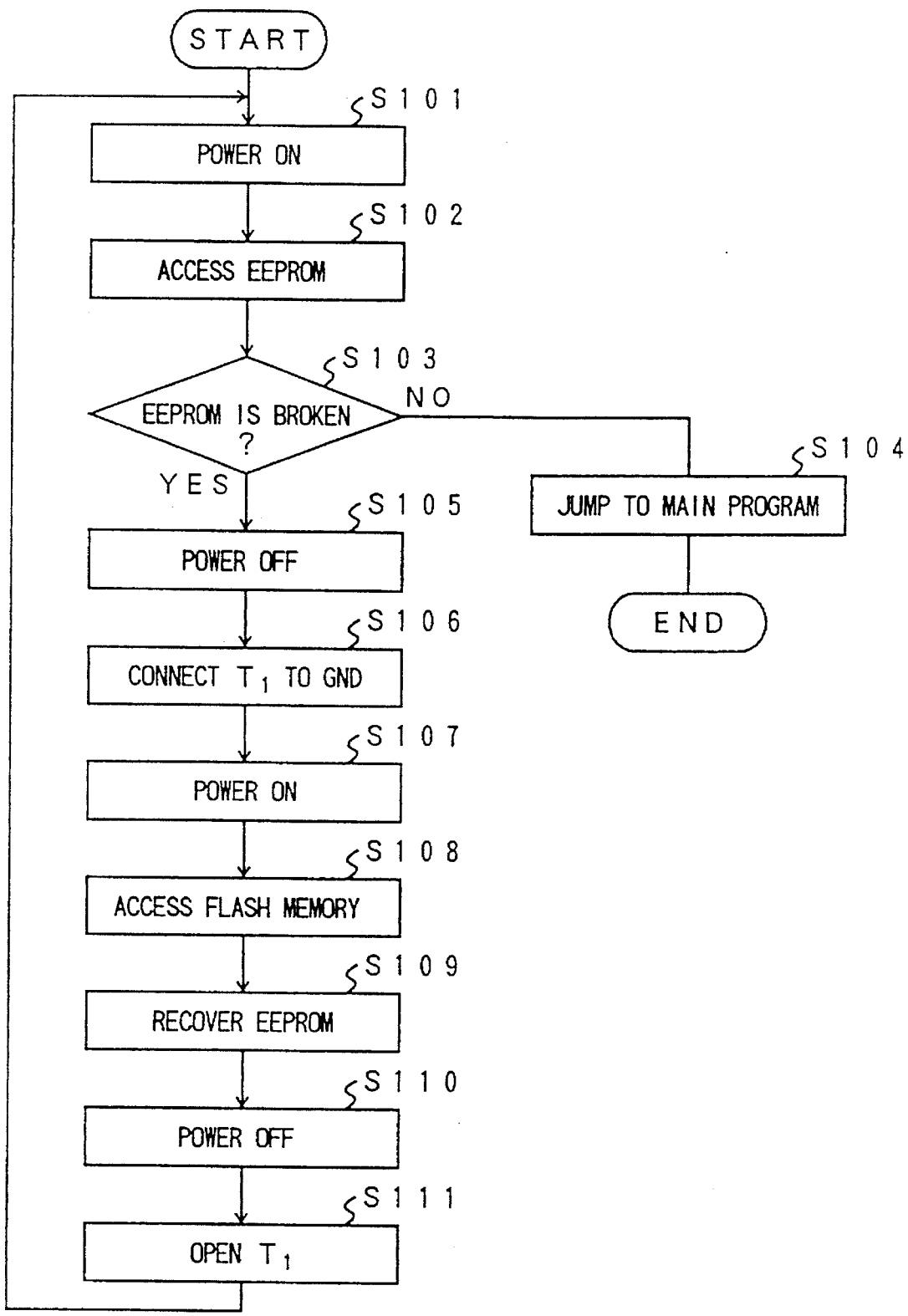
FIG. 6 is a flow chart illustrating a process in a power-on state.

When a new main program is loaded into the flash memory 32 in order to upgrade the portable telephone set 100, the portable telephone set 100 is set on a program unit 300 as shown in FIG. 5. Referring to FIG. 5, data input/output terminals of the program unit 300 are respectively connected to data input/output terminals coupled to the CPU 10 of the portable telephone set 100. In addition, a control output terminal $PT_1$ and a power output terminal $PT_2$ of the program unit 300 are respectively connected to the control terminals $T_1$ and $T_2$ of the portable telephone set 100. A control terminal $PT_3$ of the program unit 300 is connected to the input terminal $T_3$ of the portable telephone set 100. The power supply of the portable telephone set 100 is controlled by a control signal output from the control terminal $PT_3$ of the program unit 300. The program unit 300 is provided with an LED 42 and a start switch 41.

Figure 7:
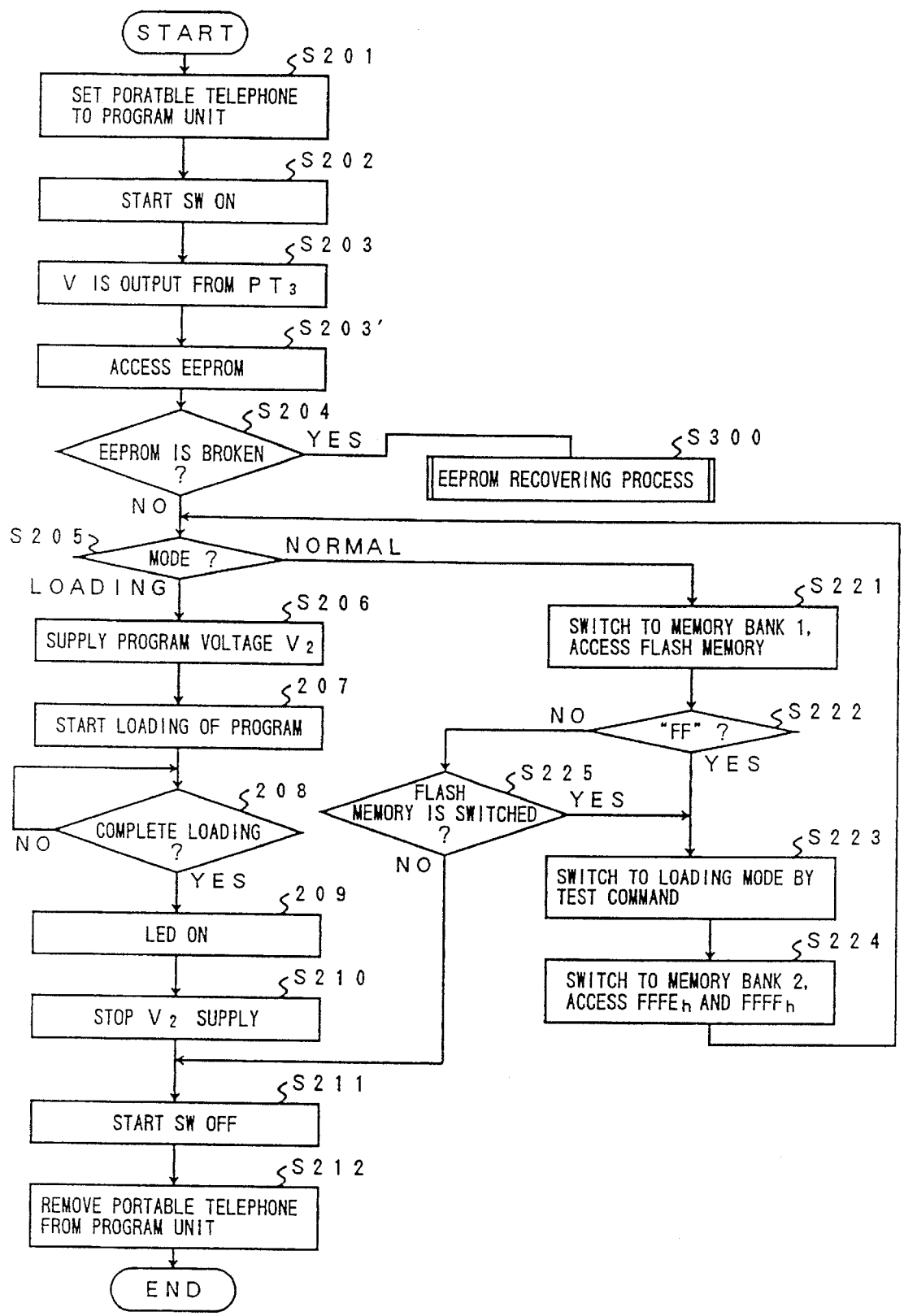
FIG. 7 is a flow chart illustrating a process for loading a program into a flash memory.

A process is carried out in accordance with a flow chart shown in FIG. 7.

When, after the portable telephone set 100 is set to the program unit 300 as has been described above (S201), the start switch 41 is operated (S202), and a control voltage V (e.g. 5 v) is outputted from the control terminal $PT_3$ of the program unit 300 (S203). The portable telephone set 100 is turned on when the control voltage V is supplied to the input terminal $T_3$ thereof. The EEPROM 22 is then accessed (S203'). If the EEPROM 22 is normal (S204), it is determined what mode is set (S205). If a loading mode has been set, the program voltage $V_2$ (e.g. 12 v) outputted from the output terminal PT2 of the program unit 300 is supplied to the flash memory 21 via the input terminal $T_2$ of the portable telephone set 100 (S206). In this state, a new program is loaded in the flash memory 21 in accordance with a loading program stored in the EEPROM 22 (S207). When the new program is completely loaded in the flash memory 21 (S208), the LED 42 is turned on (S209) in the program unit 300 and the output of the program voltage $V_2$ is then stopped (S210). After recognizing the light of the LED 42, the operator switches the start switch 41 to off (S211), and removes the portable telephone set 100 from the program unit 100 (S212).

When it is determined, in the above step (S205), that a normal mode has been set, the second memory bank (2) is switched to the first memory bank (1) and the flash memory 21 is accessed (S221). It is then determined whether or not information stored in the flash memory 21 is "FF" (whether or not the flash memory 21 is empty) (S222). If the program is not stored in the flash memory 21, the mode is switched to the loading mode by a test command (S223) and the first memory bank (1) is switched to the second memory bank (2) so that addresses FFFE$_h$ and FFFF$_h$ of the EEPROM 22 are accessed (S224). After this, the process returns to step S205. On the other hand, if it is determined, in step S222, that the program is stored in the flash memory 21, it is further determined whether or not the program stored in the flash memory 21 is rewritten (S225). If it is not necessary to rewrite the program stored in the flash memory 21, the process proceeds to the end via steps S211 and S212. If it is necessary to rewrite the program stored in the flash memory 21, the process returns to step S205 via steps S223 and S224.

On the other hand, if the EEPROM 22 malfunctions and the process does not proceed (S204), a recovering process of the EEPROM 22 is carried out (S300). The recovering process of the EEPROM 22 is shown in FIG.8.

Figure 8:
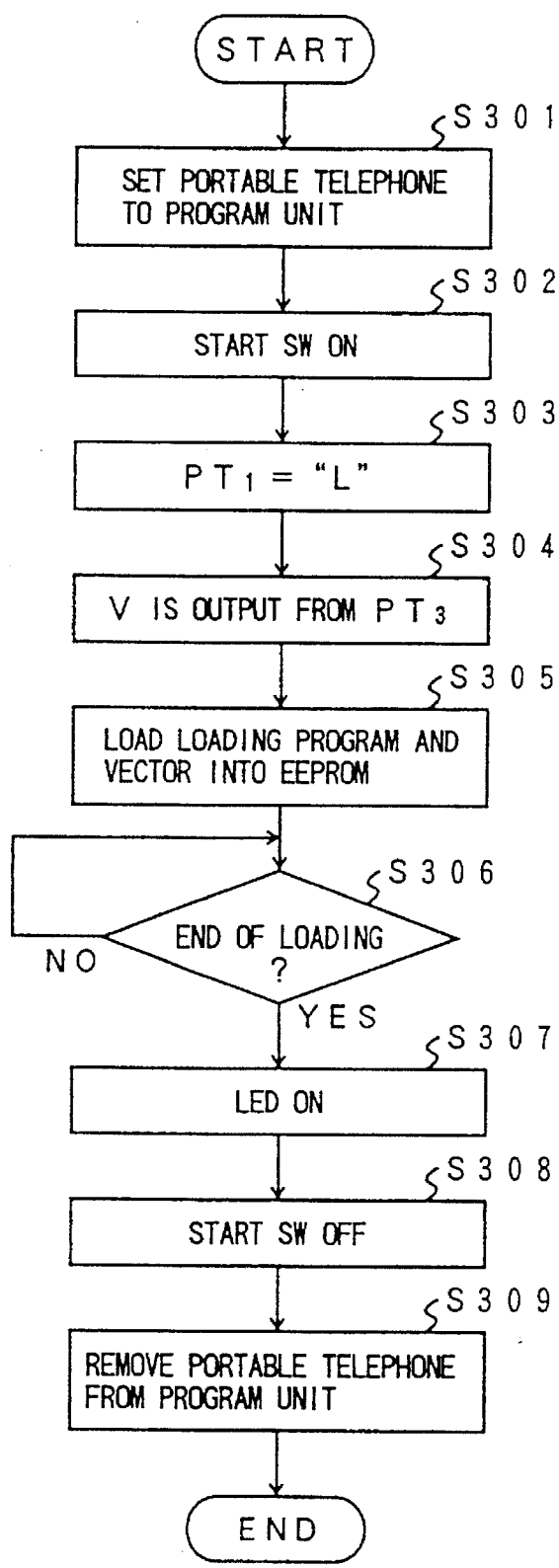
FIG. 8 is a flow chart illustrating a process for recovering an EEPROM.

Referring to FIG. 8, when the start switch 41 is turned on (S302) under a condition in which the portable telephone set 100 is connected to the program unit 100 (S301), the control output PT1 is maintained in a low level (S303) and the control voltage V is output from the output terminal $PT_3$ (S304). As a result, the power supply of the portable telephone set 100 is turned on and the first memory bank (1) is selected so that the flash memory 21 is accessed. The loading program for writing information in the flash memory 21 is then loaded in the EEPROM 21 in accordance with the loading program stored in the flash memory 21 (S305). That is, the loading program stored in the EEPROM 22 is recovered. When the loading program is completely written in the EEPROM 22 (S306), the LED 42 of the program unit 300 is turned on. The user, recognizing the light of the LED 42, switches the start switch 41 so as to turn it off (S308), and removes the portable telephone set 300 from the program unit 100 (S309).

According to the above first embodiment, a new program can be loaded in the flash memory 21 in accordance with the loading program stored in the EEPROM 22 in a state where the flash memory 21 is actually mounted in the memory unit. In addition, even if the information stored in the EEPROM 22 has been damaged, the damaged information can be recovered in a state where the EEPROM 22 is actually mounted in the memory unit.

Figure 9:
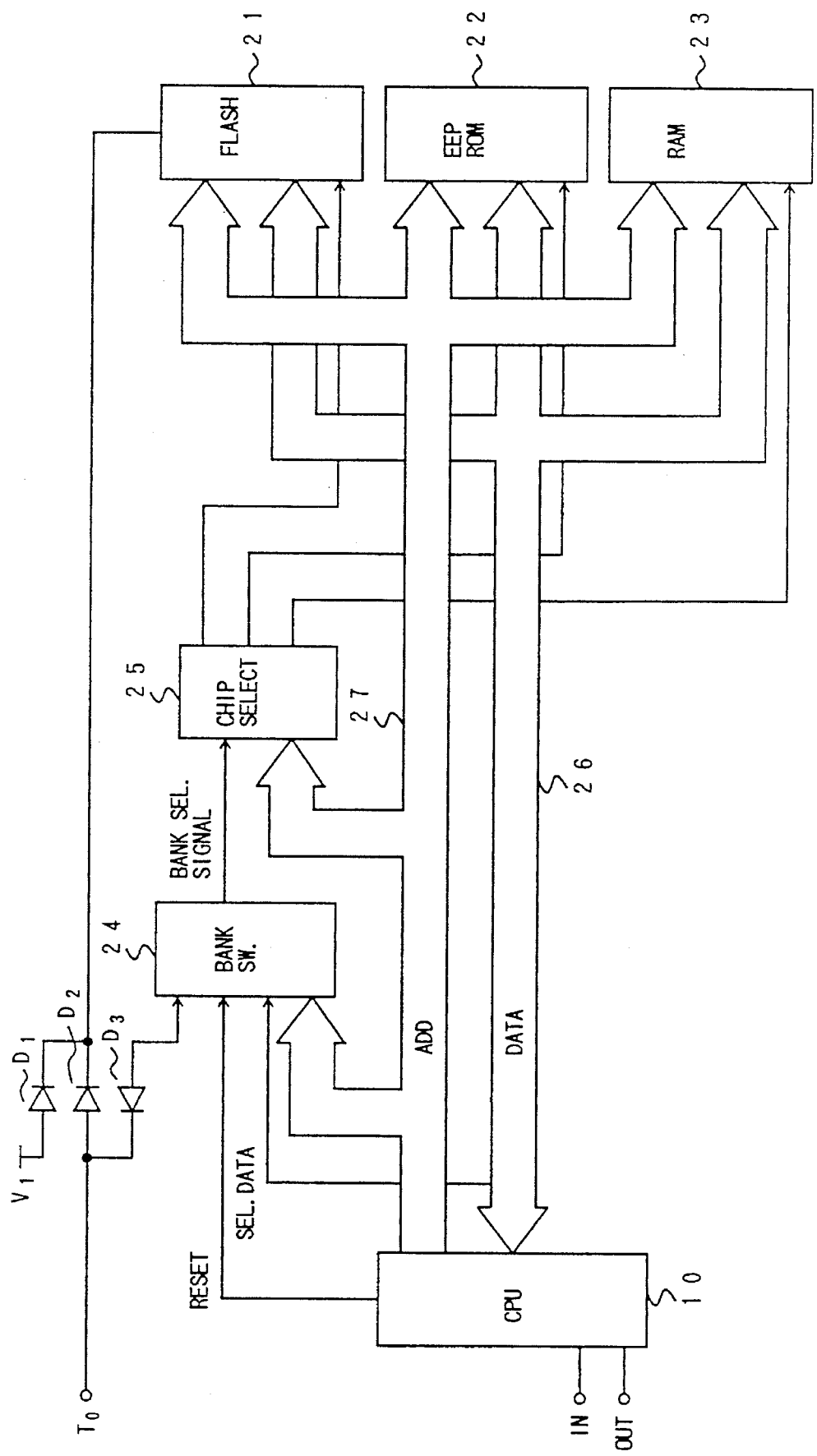
FIG. 9 is a block diagram illustrating a second embodiment of the present invention.

A description will now be given, in reference to FIG. 9 and 10, of a second embodiment of the present invention. FIG. 9 shows a control apparatus of the memory unit according to the second embodiment of the present invention. In FIG. 9, those parts which are the same as those shown in FIG.2 are given the same reference numbers.

In the second embodiment, the control terminal $T_0$ is used to supply the program voltage $V_2$ to the flash memory 21 and to initialize the bank switching circuit 24. In reference to FIG. 9, a diode $D_1$ is connected between a power line $V_1$ (e.g. 5 v) and a power terminal $V_{pp}$ so that a current flows from the power line $V_1$ to the flash memory 21 via the diode $D_1$. The cathodes of both the diodes $D_1$ and $D_2$ are connected to each other. A diode D3 is connected between the control terminal $T_0$ and a terminal $TB_2$ of the bank switching circuit 24 (see FIG. 3) so that a current flows from the bank switching circuit 24 to the control terminal via the diode $D_3$, and the cathode of the diode D3 is connected to the anode of the diode $D_2$.

In the above controller of the memory unit, the control terminal $T_0$ is normally in an open state, and the output voltage (e.g. 5 v) from the power line $V_1$ is supplied to the power terminal of the flash memory 21. Since the terminal TB2 is also pulled up to the power line V1, a current does not flow from the bank switching circuit 24 to the flash memory 21. Thus, the bank switching circuit 24 is initialized so that the bank select signal has a high level (the selection of the second memory bank (2)). Due to the power supply from the power line $V_1$, the flash memory 21 is then in a state where information can be written therein.

Here, when the control terminal $T_0$ is connected to the ground (GND) to recover the information in the EEPROM 22 (in step S106 shown in FIG. 6 and in step S303 shown in FIG. 8), due to the cathode voltage of the diode $D_1$ being greater than the anode voltage thereof, the diode $D_1$ interrupts the electric current flowing from the voltage line $V_1$ to the control terminal $T_0$. The terminal $TB_2$ of the bank switching circuit 24 then becomes the ground voltage. Thus, the bank selecting signal output from the bank switching circuit 24 is switched to the low level (the first memory bank (1) is selected).

When the program voltage $V_2$ is supplied to the control terminal $T_0$, the program voltage is further supplied to the power terminal $V_{pp}$ of the flash memory 21 via the control terminal $T_0$ and the diode $D_2$. The diode $D_3$ interrupts the supply of the program voltage $V_2$ to the bank switching circuit 24, and the diode $D_1$ interrupts the electric current from the control terminal $T_0$ toward the power line $V_1$.

Figure 10:
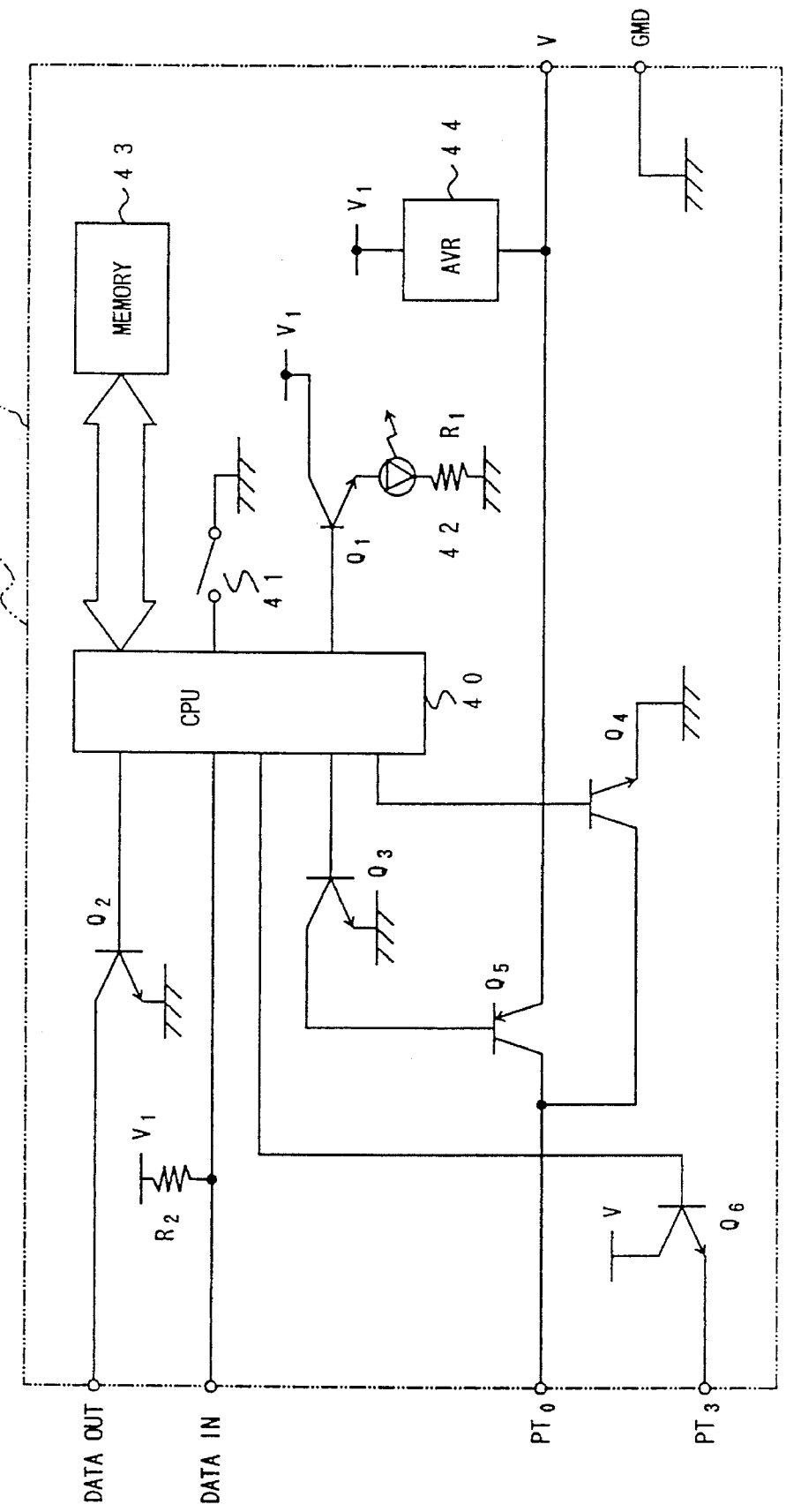
FIG. 10 is a circuit diagram illustrating a constitution of the programming unit.

In order to load a new program into the flash memory 21 in the above controller, the portable telephone set 100 is set to the program unit 300 as shown in FIG. 10.

In reference to FIG.10, the program unit 300 has a CPU 40, the start switch 41, the LED 42, and a circuit power supply 44. An external voltage (e.g. 12.8 v) is applied across a terminal V and a ground terminal (GND). Data input/output terminals (IN/OUT) and the control terminal $TB_3$ are respectively connected to the data input/output terminals (IN/OUT) and the input terminal $T_3$ of the portable telephone set 100 in the same manner as those in the case shown in FIG. 5. The control terminal $PT_0$ is connected to the control terminal $T_0$ of the portable telephone set 100 shown in FIG. 9. Transistors $Q_3$ and $Q_5$ control outputting of the program voltage $V_2$ from the control terminal $PT_0$. A transistor $Q_4$ controls the control terminals $PT_0$ in a ground state or in an open state. Due to an on-and-off operation of a transistor $Q_6$, a control signal for turning on and off the power supply of the portable telephone set 100 is outputted from the control terminal $PT_3$.

According to the above second embodiment, the control terminal $T_0$ is used to supply the program voltage $V_2$ to the flash memory and to initialize the bank switching circuit 24. That is, the control terminal is used in two functions, so that the number of terminals of the controller can be decreased.

Figure 11:
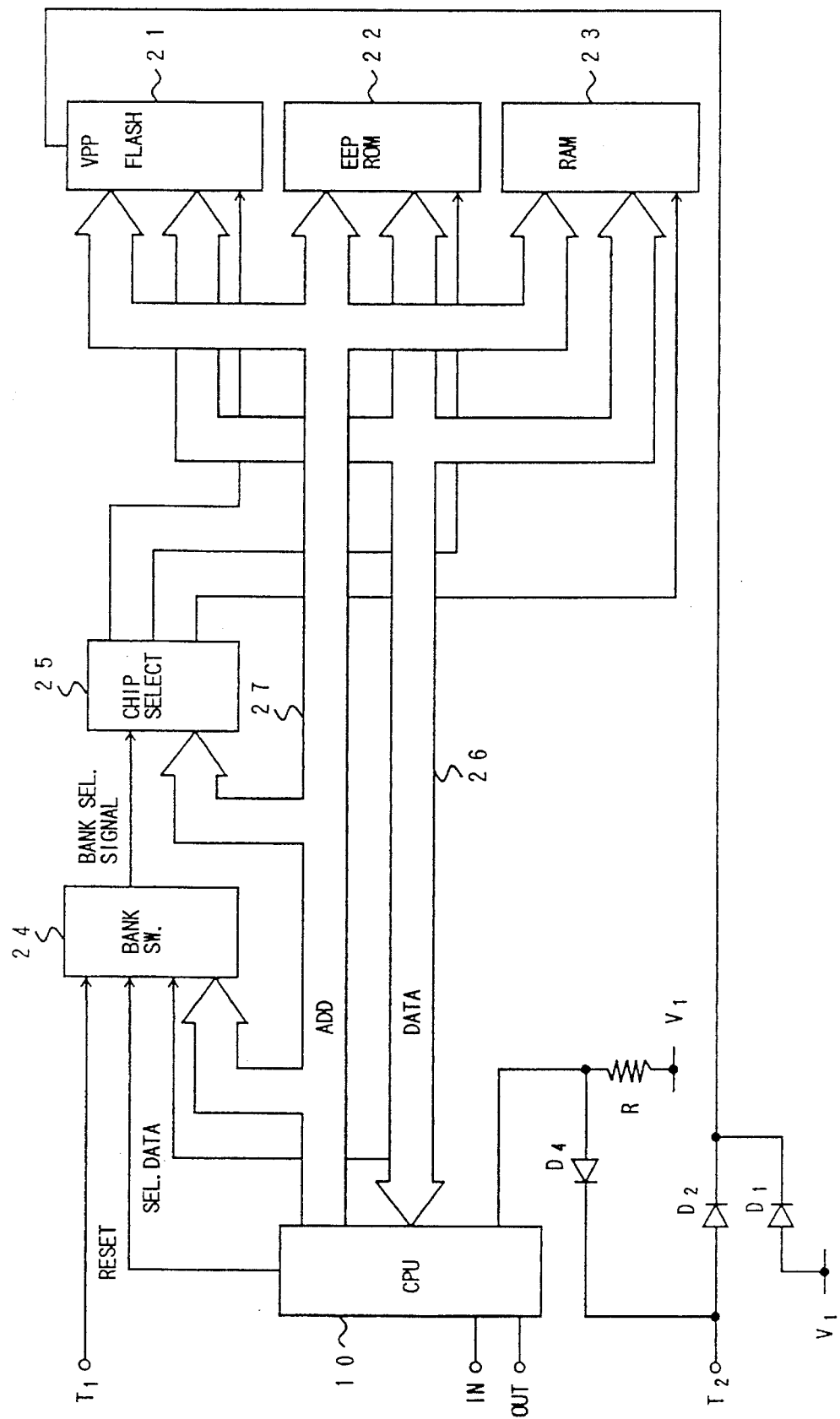
FIG. 11 is a block diagram illustrating a third embodiment of the present invention.

A description will now be given, in reference to FIGS. 11 and 12, of a third embodiment of the present invention. FIG. 11 shows a controller of the memory unit according to the third embodiment of the present invention. In FIG. 11, those parts which are the same as those shown in FIGS. 2 and 9 are given the same reference numbers.

In the third embodiment, the control terminal $T_2$ is used to supply the program voltage $V_2$ to the flash memory 21 and to input a control signal from an external unit. In refernce to FIG. 11, the diode $D_1$ is connected to the power line $V_1$ and the power terminal $V_{pp}$ of the flash memory so as to be between them, and the diode D2 is connected to the control terminal $T_2$ and power terminal $V_{pp}$ of the flash memory 21, in the same manner as the diode shown in FIG. 9. The diode $D_4$ is connected to the control terminal $T_2$ and an input terminal of the CPU 10, the input terminal being pulled up to the power line $V_1$ via a resistor R so that an electric current flows from the input terminal of the CPU 10 to the control terminal $T_2$.

In the controller described above, to load a program into the flash memory 21, the control terminal $T_2$ of the portable telephone unit 100 is connected to the control terminal $PT_0$ of the program unit 300 as shown in FIG. 10 so that the program voltage $V_2$ is supplied from the program unit 300 to the flash memory 21 via the control terminals $PT_0$ and $T_2$. The diode D4 interrupts the program voltage $V_2$ from being supplied to the input terminal of the CPU 10.

In a normal case, the voltage is supplied from the power line $V_1$ to the flash memory 21 via the diode $D_1$ in the same manner as that shown in FIG. 9.

Figure 12:
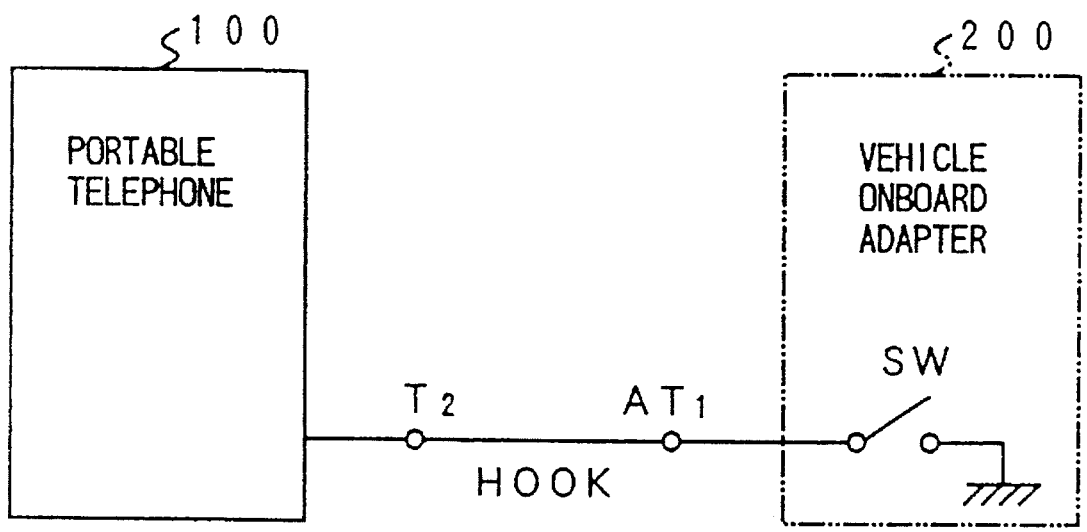
FIG. 12 is a block diagram illustrating a personal telephone set connected to a vehicle adapter.

Further, when the portable telephone set 100 is connected to the portable adapter 200, the control terminal $AT_1$ of the portable adapter 200 and the control terminal $T_2$ are connected to each other as shown in FIG. 12. The portable adapter makes the control terminal $T_1$ be in a ground potential state or in an open state. For example, a hook signal is represented by the ground potential state or the open state. In the open state of the control terminal $T_1$ of the vehicle onboard adapter 200, the voltage of the power line $V_1$ is supplied to the input terminal of the CPU 10 in the portable telephone set 100. In this case, no electric current flows through the diodes $D_4$ and $D_2$. In the ground potential state of the control terminal $T_1$ of the vehicle onboard adapter 200, the electric current flows from the power line $V_1$ toward the control terminal $T_2$, and the input terminal of the CPU 10 becomes a ground potential. In this case, the diode $D_2$ interrupts the electric current from flowing from the power line $V_1$ for the flash memory 21 to the control terminal $T_2$. The CPU 10 recognizes the on-hook and the off-hook states of the portable telephone set 100 based on a potential ($V_1$ or 0).

According to the above third embodiment, the control terminal $T_2$ is used to supply the program voltage $V_2$ to the flash memory 21 and to input a control signal from an external unit. That is, the control terminal $T_2$ is used in two functions, so that the number of terminals of the controller can be decreased.

The present invention is not limited to the aforementioned embodiments, and variations and modifications may be made without departing from the scope of the claimed invention.

What is claimed is:

1. A control apparatus for controlling a memory unit having an electrically erasable nonvolatile memory for storing nonvolatile memory information used in a process in an electrical equipment and a flash memory storing a processing program for executing the process in said electrical equipment, said control apparatus comprising:

a loading program for loading flash memory information into said flash memory, which loading program is stored in said electrically erasable nonvolatile memory;

memory selecting means for selecting said flash memory when a first selecting information is supplied to said memory selecting means, and selecting said electrically erasable nonvolatile memory when a second selecting information is supplied to said memory selecting means;

loading means for supplying the second selecting information to said memory selecting means under a condition in which a program voltage is supplied from an external power supply to said loading means and for loading flash memory information in accordance with the loading program stored in said electrically erasable nonvolatile memory selected by said memory selecting means;

recover information for recovering the loading program stored in said electrically erasable nonvolatile memory, which recovering information is stored in said flash memory;

a control terminal connected to said memory selecting means; and recover means for recovering the loading program stored in said electrically erasable nonvolatile memory in accordance with the recovering information stored in said flash memory under a condition in which said flash memory is selected by said memory selecting means to which the first selecting information is supplied via said control terminal.

2. The control apparatus as claimed in claim 1, further comprising:

process starting means for initially supplying the second selecting information when said electrical equipment is activated, and for starting a process from a predetermined address of said electrically erasable nonvolatile memory selected by said memory selecting means.

3. The control apparatus as claimed in claim 2, wherein said recover means is activated when said process starting means is not activated.

4. The control apparatus as claimed in claim 1, further comprising:

first determination means for determining, when said electrical equipment is activated, whether or not information stored in said electrically erasable nonvolatile memory malfunctions, wherein said recovery means is activated when said first determination means determines that the information stored in said electrically erasable nonvolatile memory malfunctions.

5. The control apparatus as claimed in claim 1, further comprising:

first determination means for determining, before said loading means performs a process, whether or not information stored in said electrically erasable nonvolatile memory malfunctions, wherein said recover means is activated when said first determination means determines that the information stored in said electrically erasable nonvolatile memory malfunctions.

6. The control apparatus as claimed in claim 1, wherein said control terminal is coupled to a power terminal of said flash memory via a first circuit element by which the first selecting information and the second selecting information are interrupted and through which the program voltage can pass, wherein said control terminal is coupled to said memory selecting means via a second circuit element by which the program voltage is interrupted and through which the first selecting information and the second selecting information can pass, and wherein the program voltage is supplied from said external power supply to said flash memory via said control terminal when information is loaded into said flash memory.

7. The control apparatus as claimed in claim 6, wherein said first circuit element is a diode put between said control terminal and said flash memory such that a direction from said control terminal to said power terminal of said flash memory is a forward direction of said diode.

8. The control apparatus as claimed in claim 6, wherein said second circuit element is a diode put between said control terminal and said memory selecting means such that a direction from said memory selecting means to said control terminal is a forward direction of said diode.

9. The control apparatus as claimed in claim 1, wherein said memory unit is divided into a first memory bank to which said flash memory is assigned and a second memory bank to which said electrically erasable nonvolatile memory is assigned, wherein said memory selecting means has bank switching means outputting a selecting signal, a switching signal having a first level when the first selecting information is supplied to said memory selecting means and having a second level when the second selecting information is supplied to said memory selecting means, so that said flash memory assigned to the first memory bank is selected when said bank switching means outputs the switching signal having the first level and said electrically erasable nonvolatile memory assigned to the second memory bank is selected when said bank switching means outputs the switching signal having a second level.

10. The control apparatus as claimed in claim 1, wherein said electrically erasable nonvolatile memory is an EEPROM.

11. The control apparatus as claimed in claim 1, wherein said control apparatus for controlling said memory unit is provided in a portable telephone set and said electrically erasable nonvolatile memory is used to store telephone numbers.

12. A control apparatus for controlling a memory unit having an electrically erasable nonvolatile memory for storing nonvolatile memory information used in a process in an electrical equipment and a flash memory storing a processing program for executing the process in said electrical equipment, said control apparatus comprising:

a loading program for loading flash memory information into said flash memory, which loading program is stored in said electrically erasable nonvolatile memory;

memory selecting means for selecting said flash memory when a first selecting information is supplied to said memory selecting means, and selecting said electrically erasable nonvolatile memory when a second selecting information is supplied to said memory selecting means;

a first input terminal coupled to a circuit unit in said electrical equipment via a first circuit element by which a program voltage to be supplied to said flash memory is interrupted and through which predetermined information can pass, and coupled to a power terminal of said flash memory via a second circuit element by which said predetermined information is interrupted and through which the program voltage can pass;

loading means for supplying the second selecting information to said memory selecting means under a condition in which a program voltage is supplied from an external power supply to said loading means and for loading information in accordance with the loading program stored in said electrically erasable nonvolatile memory selected by said memory selecting means, wherein said external power supply outputting the program voltage is connected to a second input terminal so that information is loaded into said flash memory by said loading means, and an external equipment outputting the predetermined information to be interrupted by said second circuit element is connected to said second input terminal so that a process is carried out in accordance with the processing program stored in said flash memory in said electrical equipment.

13. The control apparatus as claimed in claim 12, wherein the predetermined information to be interrupted by said second circuit element is represented by a ground potential and by an open state.

14. The control apparatus as claimed in claim 12, wherein said electrically erasable nonvolatile memory is an EEPROM.

15. The control apparatus as claimed in claim 12, wherein said control apparatus for controlling said memory unit is provided in a portable telephone set, and said electrically erasable nonvolatile memory is used to store a telephone number.

* * * * *